US011165033B2

United States Patent
Zan et al.

(10) Patent No.: US 11,165,033 B2
(45) Date of Patent: Nov. 2, 2021

(54) ACTIVE DEVICE

(71) Applicant: E Ink Holdings Inc., Hsinchu (TW)

(72) Inventors: Hsiao-Wen Zan, Hsinchu (TW);
Chuang-Chuang Tsai, Hsinchu (TW);
Chao-Hsuan Chen, Hsinchu (TW);
Cheng-Hang Hsu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 35 days.

(21) Appl. No.: 16/878,640

(22) Filed: May 20, 2020

(65) Prior Publication Data

US 2020/0287147 A1  Sep. 10, 2020

Related U.S. Application Data

(63) Continuation of application No. 15/096,294, filed on Apr. 12, 2016, now abandoned.

(30) Foreign Application Priority Data

Jul. 6, 2015 (TW) .................................. 104121837

(51) Int. Cl.
*H01L 51/05* (2006.01)
*H01L 51/00* (2006.01)

(52) U.S. Cl.
CPC ...... *H01L 51/0558* (2013.01); *H01L 51/0012* (2013.01)

(58) Field of Classification Search
CPC ........................ H01L 51/0558; H01L 51/0012
See application file for complete search history.

(56) References Cited

U.S. PATENT DOCUMENTS

2010/0193783 A1* 8/2010 Yamazaki ........... H01L 27/1225
257/43
2016/0358988 A1* 12/2016 Matsubara ........ H01L 29/78633

* cited by examiner

*Primary Examiner* — Vongsavanh Sengdara
(74) *Attorney, Agent, or Firm* — JCIPRNET

(57) ABSTRACT

An active device is disposed on a substrate and includes a gate, an organic active layer, a gate insulation layer, a plurality of crystal induced structures, a source and a drain. The gate insulation layer is disposed between the gate and the organic active layer. The crystal induced structures distribute in the organic active layer and directly contact with the substrate or the gate insulation layer. The source and the drain are disposed on two opposite sides of the organic active layer, wherein a portion of the organic active layer is exposed between the source and the drain.

9 Claims, 7 Drawing Sheets

ACTIVE DEVICE

CROSS-REFERENCE TO RELATED APPLICATION

This application is a continuation application of and claims the priority benefit of U.S. patent application Ser. No. 15/096,294, filed on Apr. 12, 2016, which claims the priority benefit of Taiwan application serial no. 104121837, filed on Jul. 6, 2015. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and more particularly, to an active device and a manufacturing method thereof.

Description of Related Art

Currently, when the organic semiconductor film is applied to the organic thin film transistor, the methods of film crystallization are used to increase the carrier mobility. However, there is no way to control the crystalline orientation of the crystal structure of the film, so that the film after being formed has a problem that the uniformity is not good. Generally, the film is formed by the organic solution in the solution process, and the crystals are grown nondirectionally, so that the annealing process is further performed to to improve the property of the film. In other words, the crystalline orientation of the crystal structure of the film cannot be effectively controlled by this method.

SUMMARY OF THE INVENTION

The invention provides an active device having a good crystalline uniformity film.

The invention also provides a manufacturing method of an active device, which is adapted to fabricate the above-mentioned active device.

The active device in the invention is disposed on a substrate and includes a gate, an organic active layer, a gate insulation layer, a plurality of crystal induced structures, a source and a drain. The gate insulation layer is disposed between the gate and the organic active layer. The crystal induced structures distribute in the organic active layer, wherein the crystal induced structures directly contact with the substrate or the gate insulation layer. The source and the drain are disposed on two opposite sides of the organic active layer, wherein a portion of the organic active layer is exposed between the source and the drain.

In one embodiment of the invention, the crystal induced structures separate from each other and include a plurality of point-shaped protrusions or a plurality of strip-shaped protrusions.

In one embodiment of the invention, the crystal induced structures are arranged in array or arranged dispersedly.

In one embodiment of the invention, the shapes or the sizes of the crystal induced structures are the same or different.

In one embodiment of the invention, the crystal induced structures are a plurality of nano-metal structures separated from each other or a plurality of silver-oxide nanowires partially overlapped with each other.

In one embodiment of the invention, wherein two adjacent structures of the crystal induced structures are separated by a distance, and the distance is from 100 nanometers to 10 micrometers.

In one embodiment of the invention, the active device further comprises a plurality of self-assembled monolayers which are respectively located between the crystal induced structures and the organic active layer.

In one embodiment of the invention, the materials of the self-assembled monolayers comprise pentafluorobenzene thiol, 2-mercaptoethanol (C2H6OS), octadecylphosphonic acid (OPA), or materials having thiol (SH) or phosphate particles.

In one embodiment of the invention, the organic active layer is located between the gate and the substrate, and the source and the drain are located between the gate insulation layer and the substrate.

In one embodiment of the invention, a distribution density of the crystal induced structures adjacent to the source and the drain is less than a distribution density of the crystal induced structures at a portion of the organic active layer exposed between the source and the drain.

The invention provides a manufacturing method of an active device, which includes following steps. Forming a gate on a substrate. Forming a gate insulation layer on the substrate, wherein the gate insulation layer covers the gate. Forming a plurality of crystal induced structures on the gate insulation layer, wherein the crystal induced structures directly contact with the gate insulation layer. Coating the gate insulation layer with an organic semiconductor material, wherein the crystal induced structures induce the organic semiconductor material to form crystals and to define an organic active layer. Forming a source and a drain on the organic active layer, wherein a portion of the organic active layer is exposed between the source and the drain.

In one embodiment of the invention, the methods of forming the crystal induced structures include nanoimprint method, spin coating method, slit coating method, contact coating method, ink jet coating method, or screen printing coating method, etc.

In one embodiment of the invention, the crystal induced structures induce the organic semiconductor material, so as to grow crystals of the organic semiconductor material from the crystal induced structures, and to form the organic active layer having at least a grain boundary.

In one embodiment of the invention, the manufacturing method of the active device further includes performing an acidulation process or a plasma treatment process to oxidize the crystal induced structures before coating the gate insulation layer with the organic semiconductor material, wherein the crystal induced structures are a plurality of silver nanowires partially overlapped with each other.

In one embodiment of the invention, the manufacturing method of the active device further include forming a plurality of self-assembled monolayer particles on the crystal induced structures before coating the gate insulation layer with the organic semiconductor material; and a plurality of self-assembled monolayers are formed between the crystal induced structures and the organic active layer after coating the gate insulation layer with the organic semiconductor material.

In one embodiment of the invention, the materials of the self-assembled monolayers comprise pentafluorobenzene thiol, 2-mercaptoethanol (C2H6OS), octadecylphosphonic acid (OPA), or materials having thiol (SH) or phosphate particles.

The invention provides a manufacturing method of an active device, which includes following steps. Forming a source and a drain on a substrate, wherein a portion of the substrate is exposed between the source and the drain. Forming a plurality of crystal induced structures on the source, the drain, and the portion of the substrate exposed between the source and the drain, wherein the crystal induced structures directly contact with the portion of the substrate, the source, and the drain. Coating the source, the drain, and the portion of the substrate exposed between the source and the drain with an organic semiconductor material, wherein the crystal induced structures induce the organic semiconductor material to form crystals and to define an organic active layer, and the organic active layer covers the source, the drain, and the portion of the substrate exposed between the source and the drain. Forming a gate insulation layer on the substrate, wherein the gate insulation layer covers the organic active layer, the source, and the drain. Forming a gate on the gate insulation layer.

In one embodiment of the invention, the methods of forming the crystal induced structures include nanoimprint method, spin coating method, slit coating method, contact coating method, ink jet coating method, or screen printing coating method, etc.

In one embodiment of the invention, the crystal induced structures induce the organic semiconductor material, so as to grow crystals of the organic semiconductor material from the crystal induced structures, and to form the organic active layer having at least a grain boundary.

In one embodiment of the invention, the manufacturing method of the active device further includes forming a plurality of self-assembled monolayer particles on the crystal induced structures before coating the source, the drain, and the portion of the substrate exposed between the source and the drain with the organic semiconductor material; and a plurality of self-assembled monolayers are formed between the crystal induced structures and the organic active layer after coating the source, the drain, and the portion of the substrate exposed between the source and the drain with the organic semiconductor material.

In one embodiment of the invention, the materials of the self-assembled monolayers comprise pentafluorobenzene thiol, 2-mercaptoethanol (C2H6OS), octadecylphosphonic acid (OPA), or materials having thiol (SH) or phosphate particles.

Based on the above, the organic semiconductor material is induced to form crystals via the crystal induced structures, wherein the crystals of the organic semiconductor material are preferably grown from the crystal induced structures, so as to form the organic active layer which has a good uniformity and a good crystallinity. Therefore, the active device of the invention can have a good crystalline uniformity film.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF THE EMBODIMENTS

Figure 1:
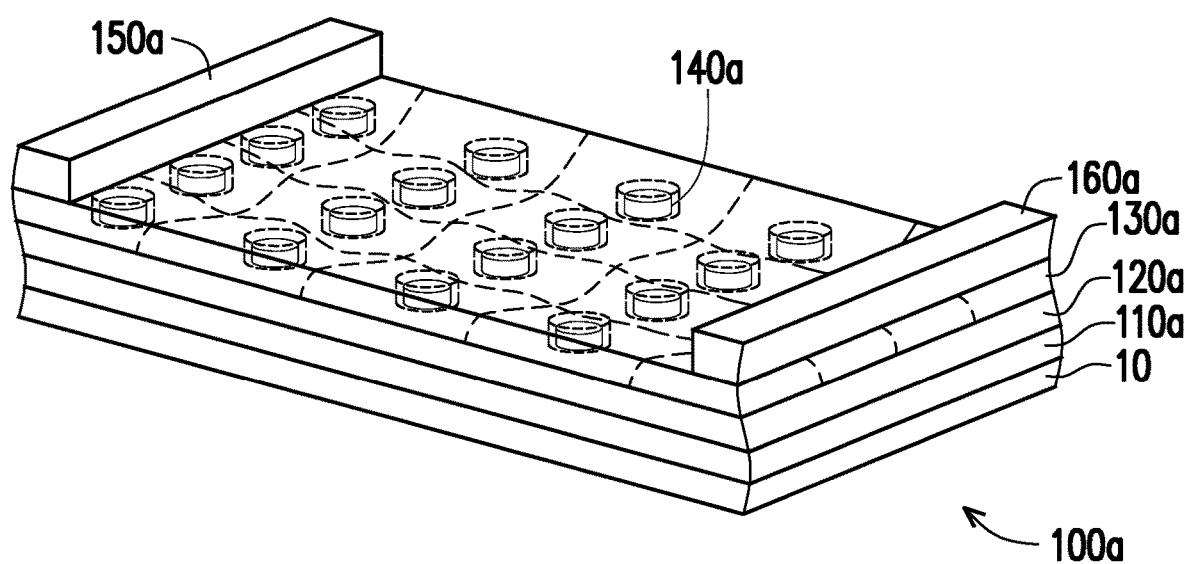
FIG. 1 is a perspective schematic view of an active device according to one embodiment of the invention.

FIG. 1 is a perspective schematic view of an active device according to one embodiment of the invention. Referring to FIG. 1, in the present embodiment, the active device 100a is disposed on a substrate 10 and includes a gate 110a, a gate insulation layer 120a, an organic active layer 130a, a plurality of crystal induced structures 140a, a source 150a and a drain 160a. The gate insulation layer 120a is disposed between the gate 110a and the organic active layer 130a. The crystal induced structures 140a distribute in the organic active layer 130a, wherein the crystal induced structures 140a directly contact with the gate insulation layer 120a and separate from each other. The source 150a and the drain 160a are disposed on two opposite sides of the organic active layer 130a, wherein a portion of the organic active layer 130a is exposed between the source 150a and the drain 160a.

To be more specific, the active device 100a of the present embodiment is disposed on the substrate 10, wherein the gate 110a is disposed on the substrate 10 and directly contact with the substrate 10. The gate insulation layer 120a covers the gate 110a and a part of the substrate 10, and the crystal induced structures 140a directly contact with the gate insulation layer 120a, wherein the crystal induced structures 140a are embodied to be arranged in array on the gate insulation layer 120a, but the invention is not limited thereto. As shown in FIG. 1, the crystal induced structures 140a in the present embodiment are, for example, a plurality of point-shaped protrusions (such as a cylindrical shape), wherein the shapes and the sizes of the crystal induced structures 140a are substantially the same. In other words, the shapes of the crystal induced structures 140a are exactly the same, and the sizes of the crystal induced structures 140a are also exactly the same, but the invention is not limited thereto. Preferably, the crystal induced structures 140a are embodied as a plurality of nano-metal structures, wherein the diameter of each of the nano-metal structures is, for example, from 5 nanometers to 300 nanometers. In addition, two adjacent structures of the crystal induced structures 140a are separated by a distance D, preferably, the distance D is from 100 nanometers to 10 micrometers. The organic active layer 130a covers the crystal induced structures 140a, so that the crystal induced structures 140a distribute in the organic active layer 130a. The source 150a and the drain 160a directly contact with the organic active layer 130a and expose a portion of the organic active layer 130a.

As shown in FIG. 1, the gate 110a, the gate insulation layer 120a, the organic active layer 130a, the crystal induced structures 140a, the source 150a, and the drain 160a together construct the active device 100a which substantially is a bottom gate thin-film transistor. In other words, the active device 100a of the present embodiment is embodied as a transistor, but the invention is not limited thereto. In other embodiments not shown, the active device can also be a sensor or a solar cell. In addition, it is noted that the crystal induced structures 140a of the present embodiment are separated from each other, so that the source 150a and the drain 160a are not electrically conducted to each other via the crystal induced structures 140a. In other words, the configuration of the crystal induced structures 140a does not interfere with the electrical layout of the active device 100a.

According to FIG. 2A to FIG. 2D, the detailed description of the manufacturing method of the active device 100a' of the invention is carried out as followings. It should be noted here, the below embodiments utilize the same label and partial contents of the above embodiment, wherein the same labels are adopted to represent same or similar elements and the description of similar technical content should be referenced to the above-mentioned embodiments. Hereinafter, the description of similar technical content is omitted.

Figure 2A:
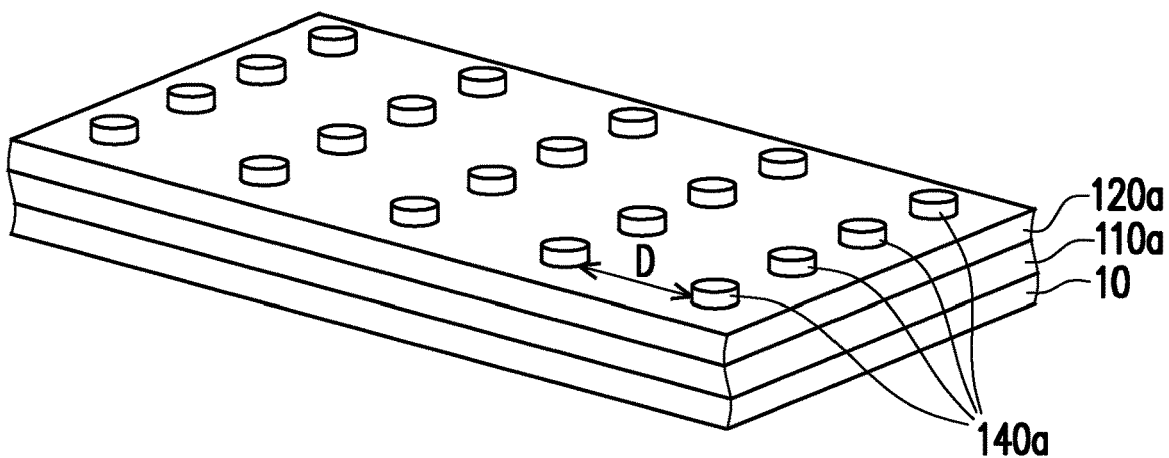
FIG. 2A(a) to FIG. 2D are perspective schematic views illustrating a manufacturing method of an active device according to one embodiment of the invention.
Figure 2A:
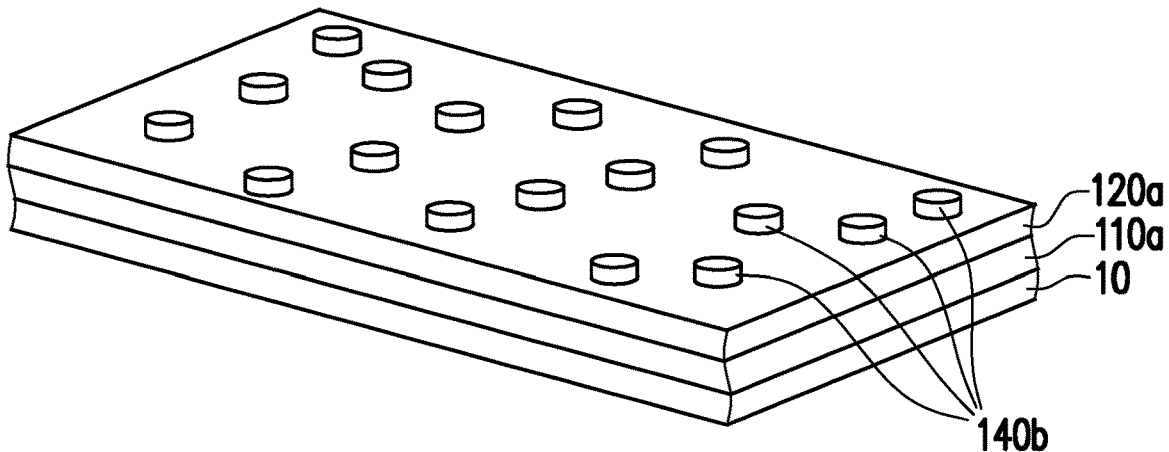
Figure 2A:
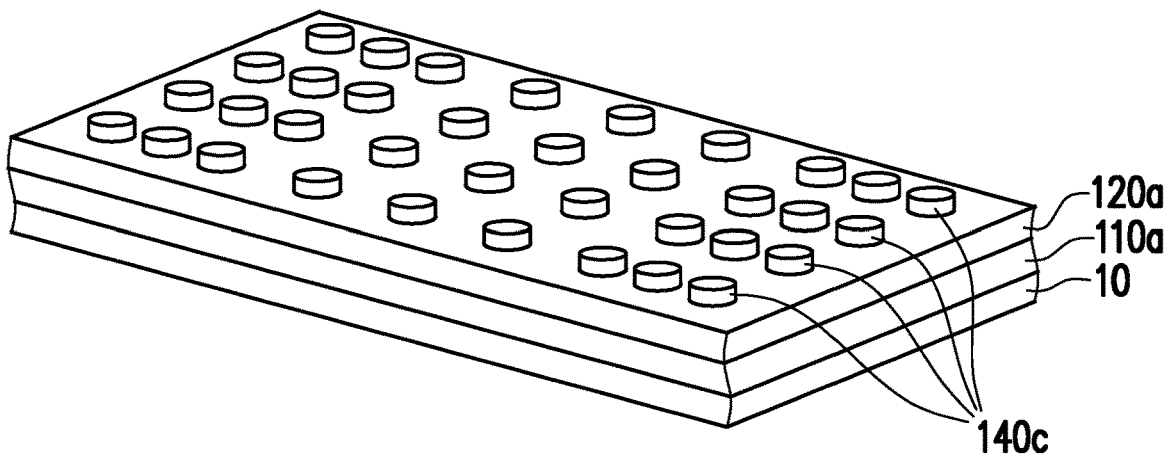
Figure 2A:
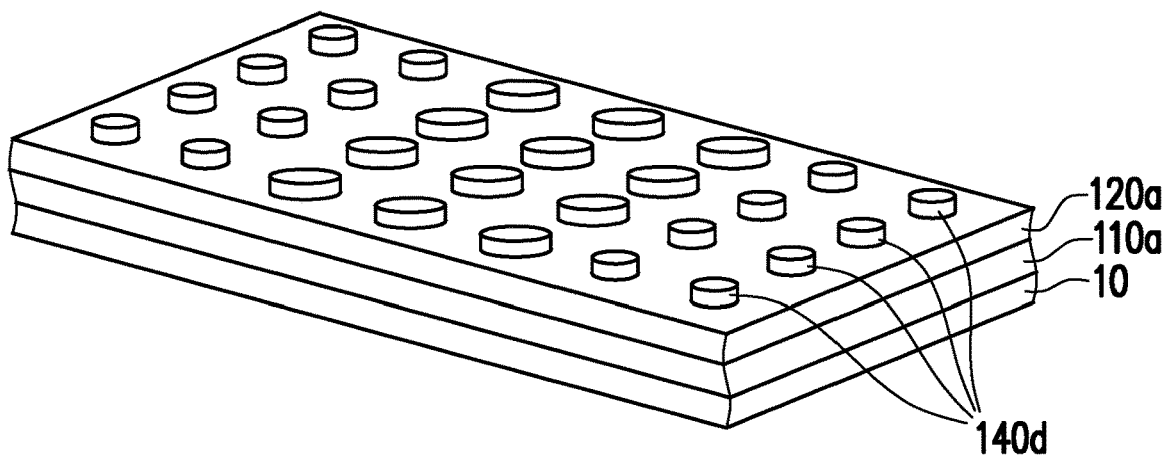
Figure 2A:
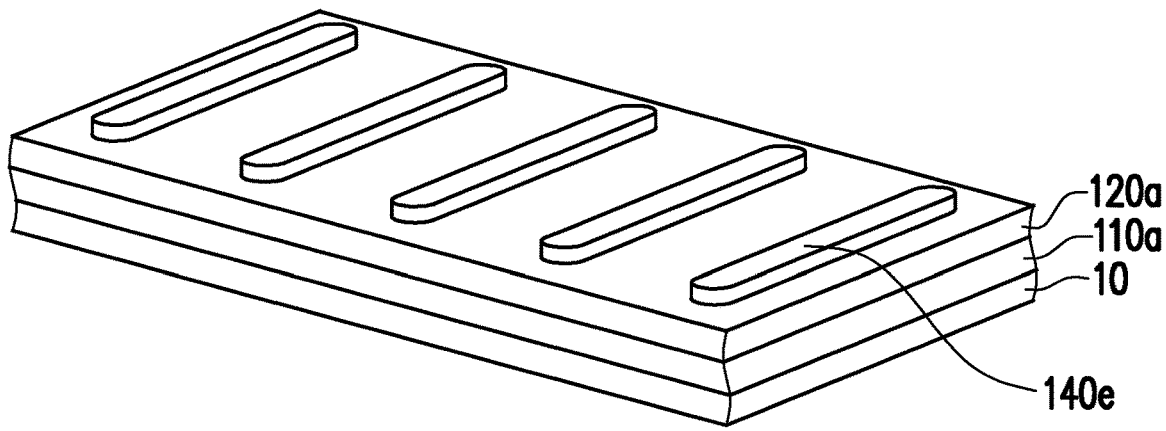
Figure 2A:
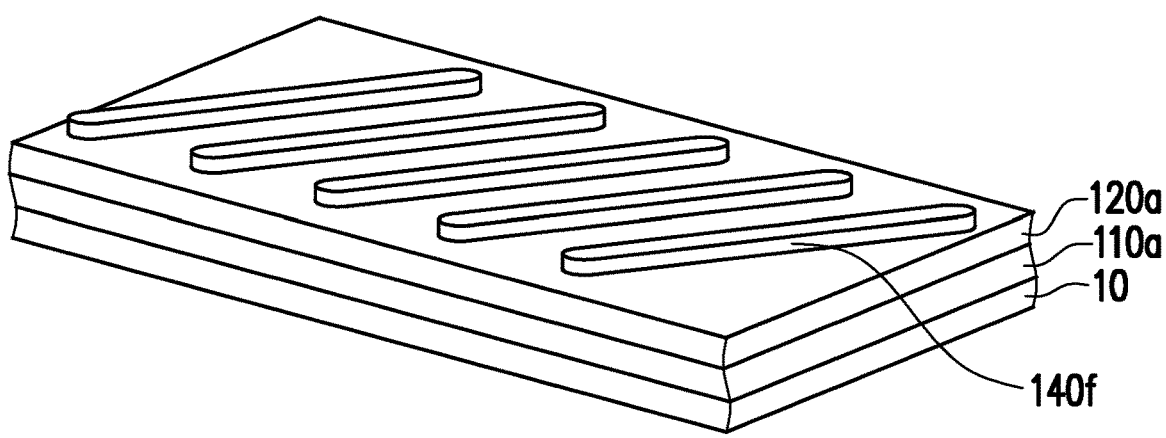
Figure 2B:
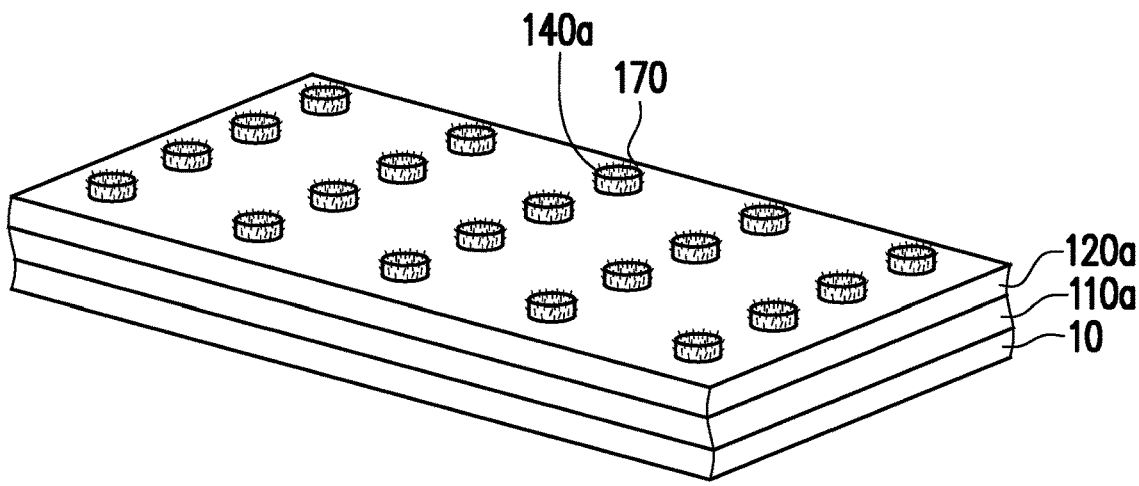
Figure 2C:
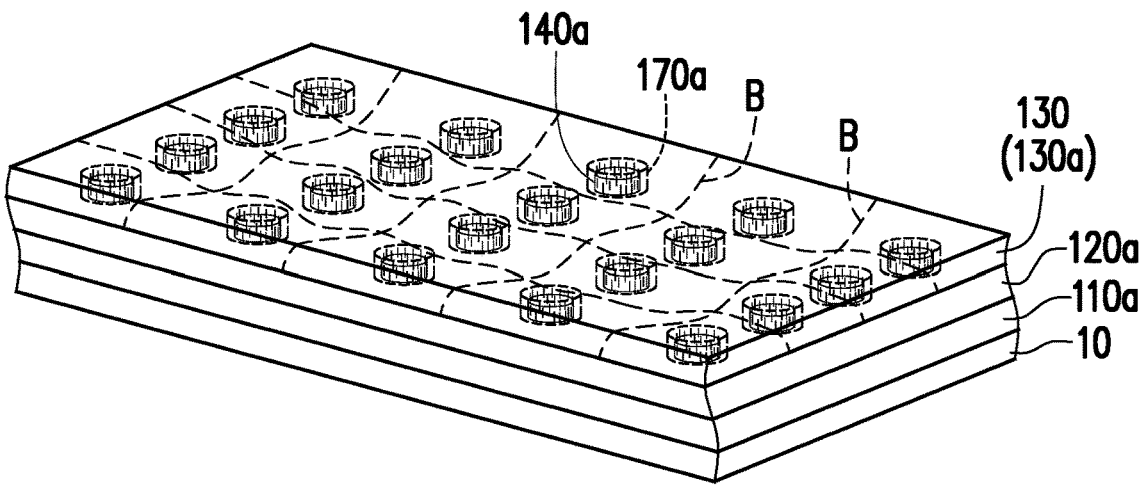
Figure 2D:
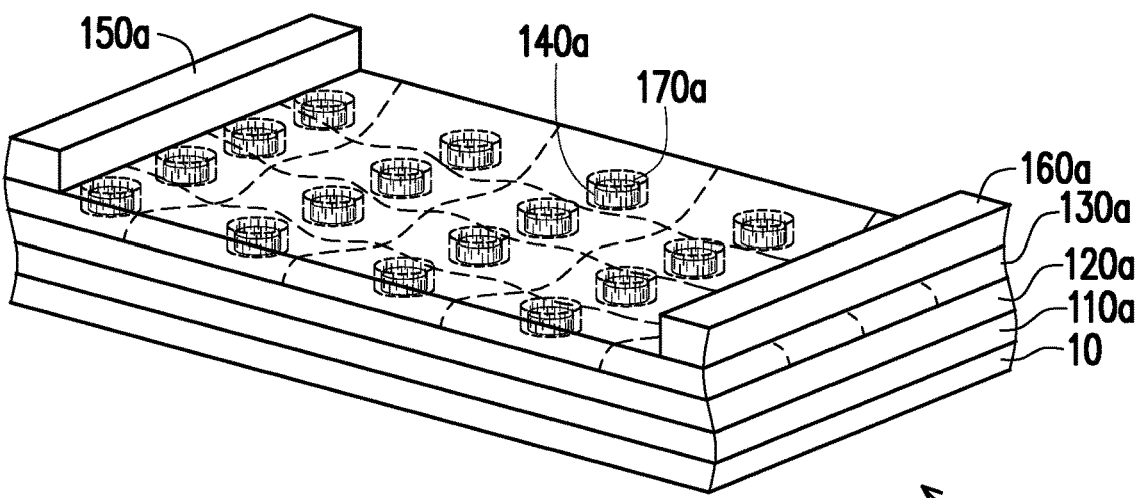

FIG. 2A(a) to FIG. 2D are perspective schematic views illustrating a manufacturing method of an active device according to one embodiment of the invention. According to the manufacturing method of the thin-film transistor structure of the present embodiment, firstly, referring to FIG. 2A(a), forming the gate 110a on the substrate 10, wherein the material of the substrate 10 is, for example, glass, plastic or other appropriate materials.

Sequentially, forming the gate insulation layer 120a on the substrate 10, wherein the gate insulation layer 120a covers the gate 110a. Herein, the material of the gate insulation layer 120a is, for example, silicon oxide, silicon nitride, silicon oxynitride, aluminium oxide, hafnium oxide, antimony tin oxide, or etc. materials used in the gate insulating layer 120a.

Sequentially, forming a plurality of crystal induced structures 140a on the gate insulation layer 120a, wherein the crystal induced structures 140a directly contact with the gate insulation layer 120a and the crystal induced structures 140a are separated from each other. In the present embodiment, the method of forming the crystal induced structures 140a is, for example, nanoimprint method, spin coating method, slit coating method, contact coating method, ink jet coating method, or screen printing coating method, etc. As shown in FIG. 2A(a), the crystal induced structures 140a is embodied to be arranged in array on the gate insulation layer 120a, wherein the crystal induced structures 140a are, for example, a plurality of point-shaped protrusions (such as a cylindrical shape), and the shapes and the sizes of the crystal induced structures 140a are substantially the same. Preferably, the crystal induced structures 140a are embodied as a plurality of nano-metal structures, wherein the diameter of each of the nano-metal structures is, for example, from 5 nanometers to 300 nanometers. In addition, two adjacent structures of the crystal induced structures 140a are separated by a distance D, preferably, the distance D is from 100 nanometers to 10 micrometers.

It is noted that the invention is not limited to the structural shape and the arrangement method of the crystal induced structures 140a. As shown in FIG. 2A(b), the crystal induced structures 140b are arranged dispersedly; or, as shown in FIG. 2A(c), the distribution density of the crystal induced structures 140c at the middle of the gate insulation layer 120a presents a low density, and the distribution density of the crystal induced structures 140c at two sides of the gate insulation layer 120a presents a high density, namely, the distribution density of the crystal induced structures 140c adjacent to the source 150a and the drain 160a is higher than the distribution density of the crystal induced structures 140c at a portion of the organic active layer 130a exposed between the source 150a and the drain 160a (referring to FIG. 1 and FIG. 2D), the purpose is forming smaller grains adjacent to the electrode, so as to inhibit the high electrical field effect; or, as shown in FIG. 2A(d), the shapes of the crystal induced structures 140d are the same but the sizes of the crystal induced structures 140d are completely different, for example, the sizes of the crystal induced structures 140d at the middle of the gate insulation layer 120a are bigger than the sizes of the crystal induced structures 140d at two sides of the gate insulation layer 120a but the shapes of the crystal induced structures 140d are the same, the purpose is preventing the current leakage problem between the source 150a and the drain 160a; certainly, in other embodiments not shown, the shapes of the crystal induced structures are different but the sizes of the crystal induced structures are the same; or, the shapes and the sizes of the crystal induced structures are different; or, as shown in FIG. 2A(e), the crystal induced structures 140e are, for example, a plurality of strip-shaped protrusions, the purpose is inducing long trip grains, so as to increase the carrier mobility at the long edges in the longitudinal direction, and to increase the conductive current; or, as shown in FIG. 2A(f), the crystal induced structures 140f are, for example, a plurality of strip-shaped protrusions which present an inclined angle, such as a 45 degree, and be arranged at intervals on the gate insulation layer 120a, the purpose is preventing electric leakage formed by the strip grain boundary. The above-mentioned embodiments still belong to a technical means adoptable in the present invention and fall within the protection scope of the present invention.

Subsequently, referring to FIG. 2B, in order to increase the surface energy of the crystal induced structures 140a, a plurality of self-assembled monolayer particles 170 are optionaly formed on the crystal induced structures 140a.

After that, referring to FIG. 2C, coating the gate insulation layer 120a with an organic semiconductor material 130, wherein the crystal induced structures 140a induce the organic semiconductor material 130 to form crystals and to define an organic active layer 130a. Specifically, the crystal induced structures 140a of the present embodiment can induce the organic semiconductor material 130, so as to grow crystals of the organic semiconductor material 130 from the crystal induced structures 140a, and to form the organic active layer 130a which has at least a grain boundary B. Because the self-assembled monolayer particles 170 are optionally formed on the crystal induced structures 140a, a plurality of self-assembled monolayers 170a are formed between the crystal induced structures 140a and the organic active layer 130a. Herein, the self-assembled monolayers 170a has a property that the self-assembled monolayers 170a can change the surface energy of the crystal induced structures 140a, so as to improve effectively the arrangement method of the particles in the organic active layer 130a when crystallizing, to control effectively the crystal structure of the organic active layer 130a, and to form a layer having a good uniformity and a good crystallinity. In addition, the organic semiconductor material 130 of the present embodiment is an organic semiconductor material which has solubility, such as 5,11-bis (triethylsilylethynyl) anthradithiophene (DiF-TESADT), 6,13-bis (triisopropylsilylethynyl) pentacene (TIPS-pentacene), etc. Furthermore, the materials of the self-assembled monolayers comprise pentafluorobenzene thiol, 2-mercaptoethanol (C2H6OS), octadecylphosphonic acid (OPA), or materials having thiol (SH) or phosphate particles.

Finally, referring to FIG. 2D, forming a source 150a and a drain 160a on the organic active layer 130a, wherein a portion of the organic active layer 130a is exposed between the source 150a and the drain 160a. Herein, the material of the source 150a and the drain 160a is, for example, metal which is the same as or different from the metal adopted by the gate 110a, but the invention is not limited thereto. Thereby, the fabrication of the active device 100a' is completed.

Figure 3:
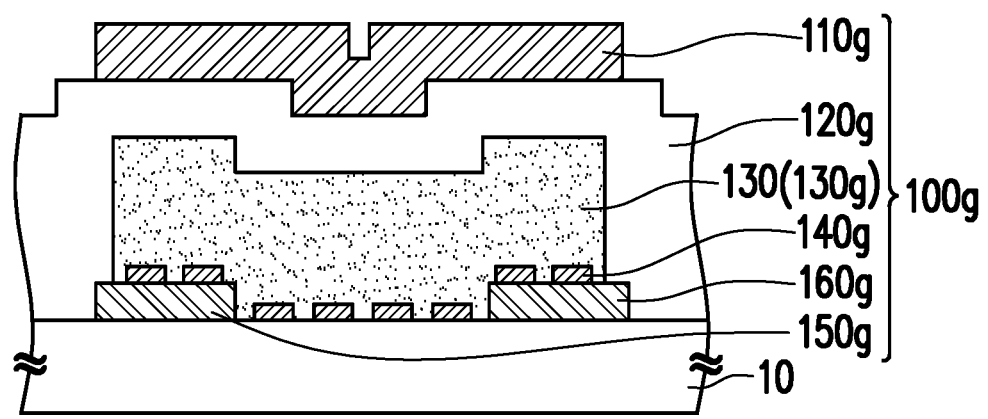
FIG. 3 is a cross-sectional schematic view illustrating an active device according to another embodiment of the invention.

FIG. 3 is a cross-sectional schematic view illustrating an active device according to another embodiment of the invention. Referring to FIG. 3, the active device 100g of the present embodiment is similar to the active device 100a in FIG. 1, but the main differences the two active devices are that the active device 100g of the present embodiment is embodied as a top gate thin-film transistor, wherein the organic active layer 130g is located between the gate insulation layer 120g and the substrate 10, and the source 150g and the drain 160g are located between the gate insulation layer 120g and the substrate 10.

To be more specific, in the process, firstly, forming the source 150g and the drain 160g on a substrate 10, wherein the portion of the substrate 10 is exposed between the source 150g and the drain 160g. Subsequently, forming the crystal induced structures 140g on the source 150g, the drain 160g, and the portion of the substrate 10 exposed between the source 150g and the drain 160g, wherein the crystal induced structures 140g directly contact with the portion of the substrate 10, the source 150g, and the drain 160g and the crystal induced structures 140g separate from each other. After that, coating the source 150g, the drain 160g, and the portion of the substrate 10 exposed between the source 150g and the drain 160g with the organic semiconductor material 130, wherein the crystal induced structures 140g induce the organic semiconductor material 130 to form crystals and to define the organic active layer 130g, and the organic active layer 130g covers the source 150g, the drain 160g, and the portion of the substrate 10 exposed between the source 150g and the drain 160g. Forming the gate insulation layer 120g on the substrate 10, wherein the gate insulation layer 120g covers the organic active layer 130g, the source 150g, and the drain 160g. Forming the gate 110g on the gate insulation layer 120g. Thereby, the fabrication of the active device 100g is completed.

It is noted that the active device 100g without the self-assembled monolayers 170a of the present embodiment is explained as an example. Certainly, the manufacturing method of the active device 100g of the present embodiment can be the same as the manufacturing method of the active device 100a' of the above-mentioned embodiment, the manufacturing method of the active device 100g further includes optionally forming a plurality of self-assembled monolayer particles 170 (as shown in FIG. 2B) on the crystal induced structures 140g before coating the source 150g, the drain 160g, and the portion of the substrate 10 exposed between the source 150g and the drain 160g with the organic semiconductor material 130; and a plurality of self-assembled monolayers 170a (as shown in FIG. 2C) are formed between the crystal induced structures 140g and the organic active layer 130g after coating the source 150g, the drain 160g, and the portion of the substrate 10 exposed between the source 150g and the drain 160g with the organic semiconductor material 130. The above-mentioned embodiments still belong to a technical means adoptable in the present invention and fall within the protection scope of the present invention.

Figure 4A:
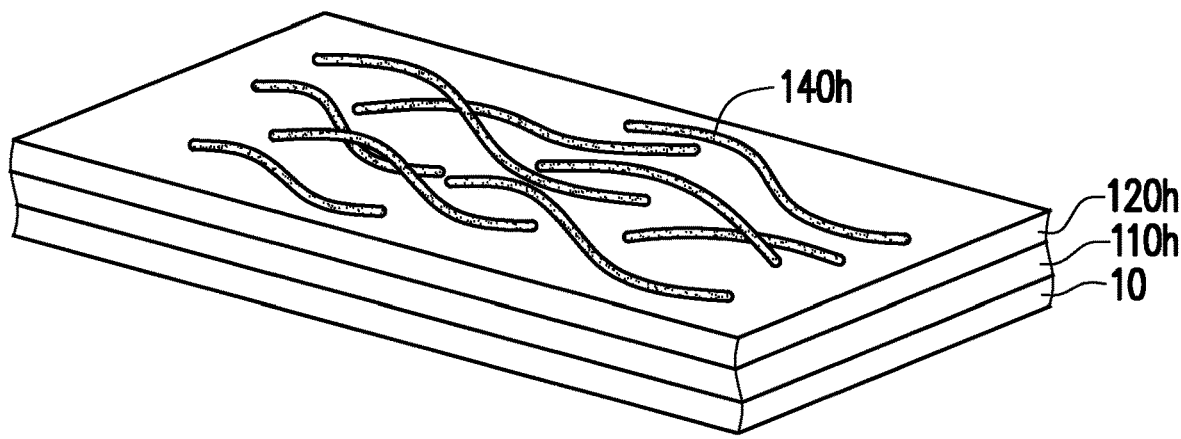
FIG. 4A to FIG. 4E are perspective schematic views illustrating a manufacturing method of an active device according to another embodiment of the invention.

FIG. 4A to FIG. 4E are perspective schematic views illustrating a manufacturing method of an active device according to another embodiment of the invention. The manufacturing method of the active device of the present embodiment is similar to the manufacturing method of the active device illustrated in FIG. 2A(a) to FIG. 2D, the main differences between two methods are described as followings. Referring to FIG. 4A, sequentially forming the gate 110h, the gate insulation layer 120h, and the crystal induced structures 140h on the substrate 10, wherein the gate insulation layer 120h covers the gate 110h, and the crystal induced structures 140h directly contact with the gate insulation layer 120h. Herein, the material of the gate 110h is, for example, silicon, and the material of the gate insulation layer 120h is, for example, silicon nitride, or silicon oxide. In addition, the crystal induced structures 140h are embodied as a plurality of silver conducting nanowires which are partially overlapped with each other.

Figure 4B:
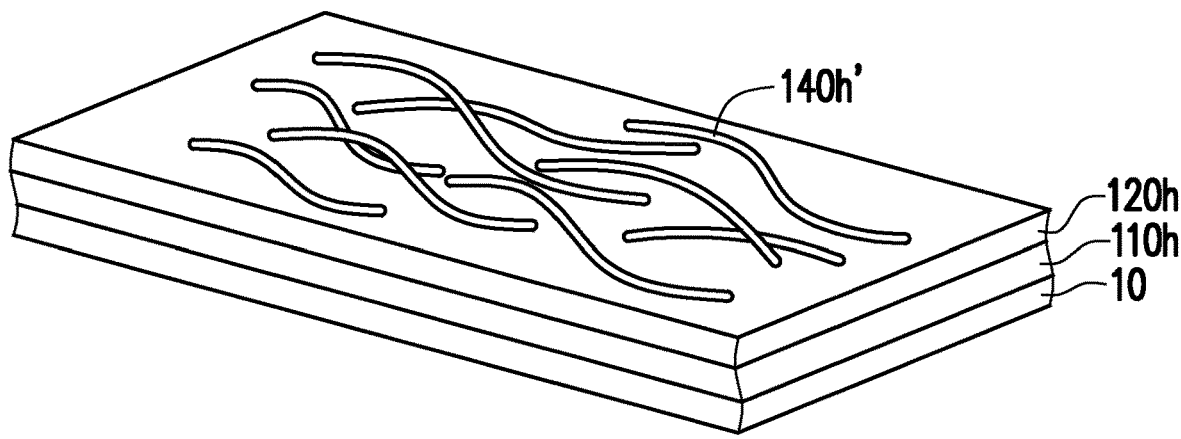

Subsequently, referring to FIG. 4B, performing an acidulation process or a plasma treatment process to oxidize the crystal induced structures 140h, and to define the crystal induced structures 140W.

Figure 4C:
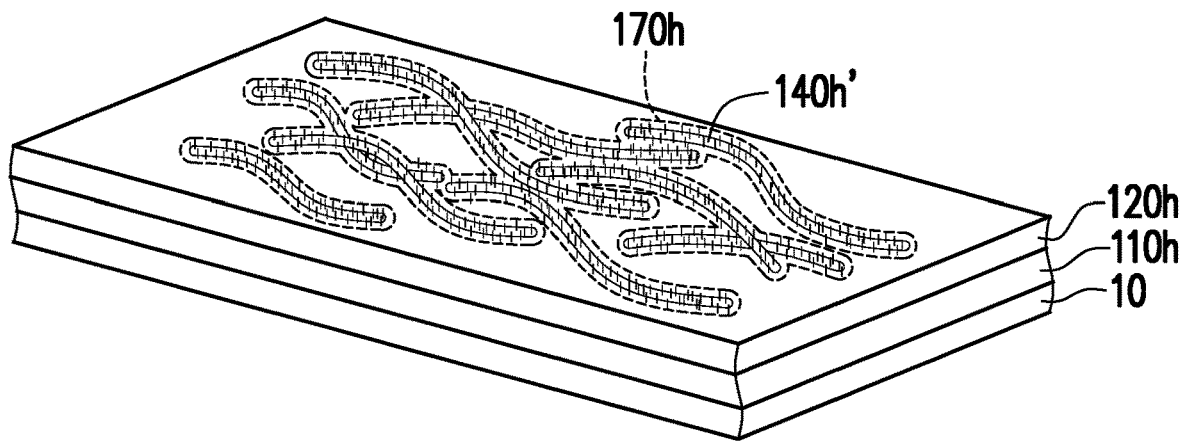

Subsequently, referring to FIG. 4C, in order to increase the surface energy of the crystal induced structures 140h, a plurality of self-assembled monolayer particles 170 are optionally formed on the crystal induced structures 140h.

Figure 4D:
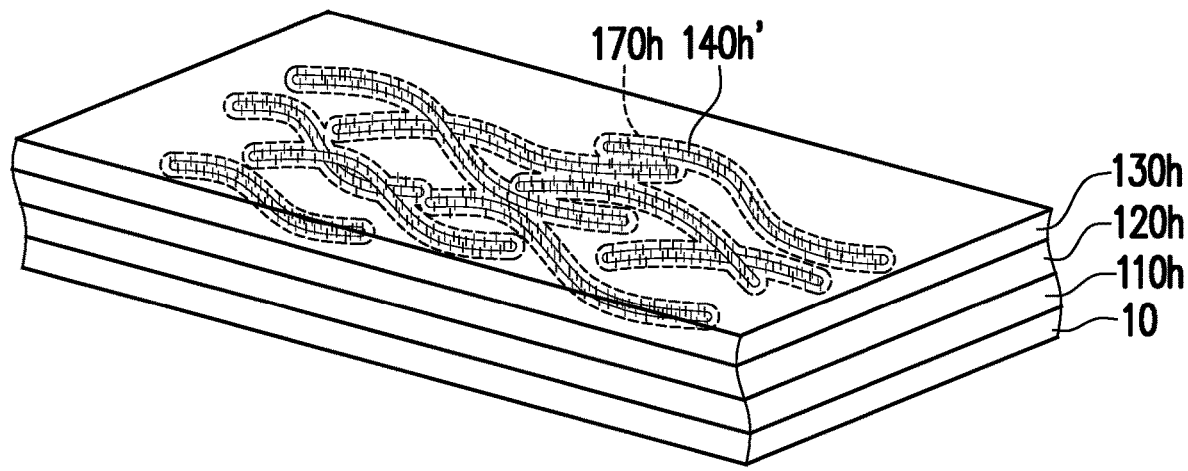

After that, referring to FIG. 4D, coating the gate insulation layer 120h with an organic semiconductor material (not shown), wherein the crystal induced structures 140h induce the organic semiconductor material to form crystals and to define an organic active layer 130h. Because the self-assembled monolayer particles 170 are optionally formed on the crystal induced structures 140h, a plurality of self-assembled monolayers 170h are formed between the crystal induced structures 140h and the organic active layer 130h. Herein, the self-assembled monolayers 170h has a property that the self-assembled monolayers 170h can change the surface energy of the crystal induced structures 140h, so as to improve effectively the arrangement method of the particles in the organic active layer 130h when crystallizing, to control effectively the crystal structure of the organic active layer 130h, and to form a layer having a good uniformity and a good crystallinity. In addition, the materials of the self-assembled monolayers 170a of the present embodiment are pentafluorobenzene thiol, 2-mercaptoethanol (C2H6OS), octadecylphosphonic acid (OPA), or materials having thiol (SH) or phosphate particles.

Figure 4E:
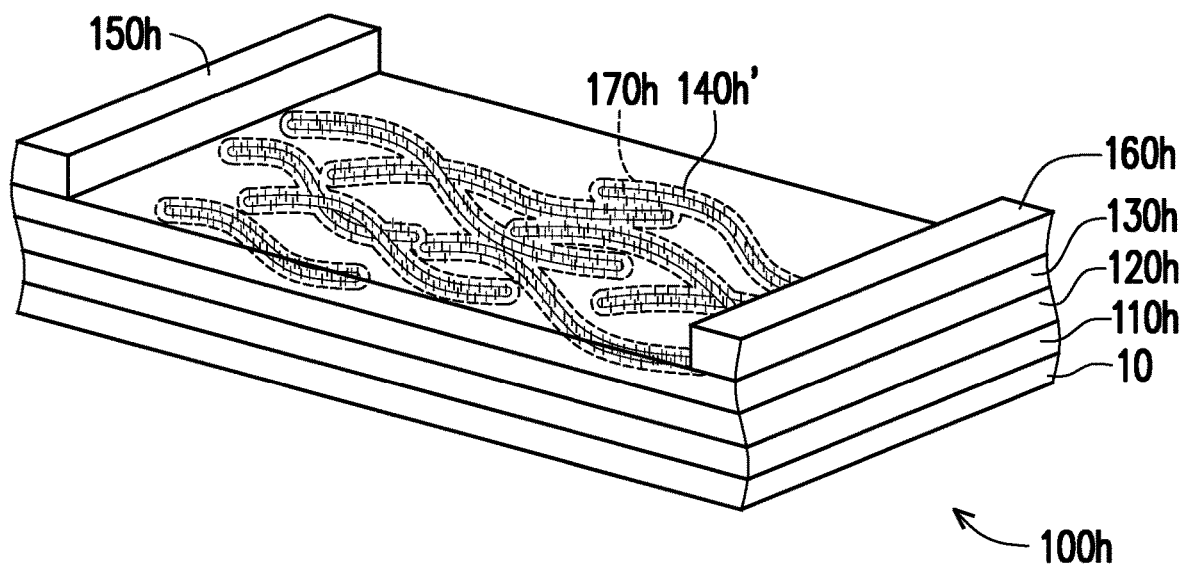

Finally, referring to FIG. 4E, forming a source 150h and a drain 160h on the organic active layer 130h, wherein a portion of the organic active layer 130h is exposed between the source 150h and the drain 160h. Herein, the material of the source 150h and the drain 160h is, for example, metal. Thereby, the fabrication of the active device 100h is completed.

In summary, the organic semiconductor material is induced to form crystals via the crystal induced structures, wherein the crystals of the organic semiconductor material are preferably grown by the crystal induced structures, so as to form the organic active layer which has a good uniformity and a good crystallinity. Therefore, the active device of the invention can having a good crystalline uniformity film.

It will be apparent to those skilled in the art that various modifications and variations can be made to the structure of the invention without detaching from the scope or spirit of the invention.

What is claimed is:
1. An active device, disposed on a substrate and comprising:
   a gate;
   an organic active layer;
   a gate insulation layer, disposed between the gate and the organic active layer;

a plurality of crystal induced structures, distributing in the organic active layer, each of the plurality of crystal induced structures surrounded by the organic active layer and inducing the organic active layer to crystallize a region of the organic active layer surrounding the corresponding crystal induced structure, wherein each region of the organic active layer has a grain boundary with an adjacent region, wherein the plurality of crystal induced structures directly contact with the substrate or the gate insulation layer, wherein the plurality of crystal induced structures are a plurality of nano-metal structures separated from each other; and a source and a drain, disposed on two opposite sides of the organic active layer, wherein each of the plurality of nano-metal structures is separated by a distance with the adjacent nano-metal structures, and the distance is from 100 nanometers to 10 micrometers.

2. The active device as recited in claim 1, wherein the plurality of crystal induced structures separate from each other and comprise a plurality of point-shaped protrusions or a plurality of strip-shaped protrusions.

3. The active device as recited in claim 1, wherein the plurality of crystal induced structures are arranged in array or arranged dispersedly.

4. The active device as recited in claim 1, wherein shapes or sizes of the plurality of crystal induced structures are the same or different.

5. The active device as recited in claim 1, wherein the organic active layer is located between the gate and the substrate, and the source and the drain are located between the gate insulation layer and the substrate.

6. The active device as recited in claim 1, wherein a distribution density of the plurality of crystal induced structures adjacent to the source and the drain is less than a distribution density of the plurality of crystal induced structures at a portion of the organic active layer exposed between the source and the drain.

7. The active device as recited in claim 1, wherein a portion of the organic active layer is exposed between the source and the drain.

8. The active device as recited in claim 1, wherein the plurality of crystal induced structures are disposed on the source or the drain.

9. The active device as recited in claim 1, wherein a top surface of the organic active layer and top surfaces of the plurality of crystal induced structures are coplanar.

\* \* \* \* \*